(12) United States Patent
Szalay et al.

(10) Patent No.: US 7,919,055 B2
(45) Date of Patent: Apr. 5, 2011

(54) METHOD OF FORMING A SEALED CHANNEL OF A MICROFLUIDIC REACTOR AND A MICROFLUIDIC REACTOR COMPRISING SUCH CHANNEL

(75) Inventors: Dániel Szalay, Budapest (HU); Norbert Varga, Tatabánya (HU); Ferenc Boncz, Budapest (HU); Ferenc Darvas, Budapest (HU); Tamás Karancsi, Budapest (HU); Lajos Gödörházy, Érd (HU)

(73) Assignee: ThalesNano Nanotechnológiai Zrt., Budapest (HU)

( * ) Notice: Subject to any disclaimer, the term of this patent is extended or adjusted under 35 U.S.C. 154(b) by 425 days.

(21) Appl. No.: 12/158,784

(22) PCT Filed: Dec. 22, 2006

(86) PCT No.: PCT/HU2006/000127
§ 371 (c)(1),
(2), (4) Date: Jul. 31, 2008

(87) PCT Pub. No.: WO2007/072099
PCT Pub. Date: Jun. 28, 2007

(65) Prior Publication Data
US 2009/0098029 A1    Apr. 16, 2009

(30) Foreign Application Priority Data

Dec. 23, 2005 (HU) .................. P 0501205

(51) Int. Cl.
*B01J 19/00* (2006.01)
*B29C 59/02* (2006.01)
*B29C 43/00* (2006.01)

(52) U.S. Cl. ........ 422/198; 422/129; 422/130; 264/320; 264/325

(58) Field of Classification Search .................. 422/129, 422/130, 198, 100; 264/320, 1.6
See application file for complete search history.

(56) References Cited

U.S. PATENT DOCUMENTS

| | | |
|---|---|---|
| 4,413,407 A | 11/1983 | Columbus |
| 5,201,996 A | 4/1993 | Gmitter et al. |
| 5,443,890 A | 8/1995 | Öhman |
| 5,534,328 A | 7/1996 | Ashmead et al. |
| 6,140,044 A | 10/2000 | Besemer et al. |
| 2003/0003024 A1 * | 1/2003 | Zech et al. .................. 422/100 |
| 2003/0026740 A1 | 2/2003 | Staats |
| 2004/0213083 A1 | 10/2004 | Fujiwara et al. |
| 2005/0247701 A1 | 11/2005 | Deka et al. |

FOREIGN PATENT DOCUMENTS

WO    WO 01/09598 A1 *    2/2001

* cited by examiner

*Primary Examiner* — Walter D Griffin
*Assistant Examiner* — Natasha Young
(74) *Attorney, Agent, or Firm* — Jason D. Voight

(57) ABSTRACT

The present invention relates to a method of forming a sealed channel on the surface of a sheet made of a material with a particular extent of plasticity, the sheet forming a reactor block for a microfluidic reactor.

16 Claims, 3 Drawing Sheets

METHOD OF FORMING A SEALED CHANNEL OF A MICROFLUIDIC REACTOR AND A MICROFLUIDIC REACTOR COMPRISING SUCH CHANNEL

This is the National Stage of International Application PCT/HU2006/0000127, filed Dec. 22, 2006.

The present invention relates to a method of forming a sealed channel on the surface of a sheet made of a material with a particular extent of plasticity, said sheet forming a reactor block for a microfluidic reactor. The present invention further relates to a microfluidic reactor comprising a sealed channel provided with an inlet and an outlet, both communicating with the external environment of the reactor, and used for accommodating a chemical reaction, wherein the reactor further comprising a first and a second limiting member held and clamped together by fastening means, a closing member and a cooling chamber communicating with the external environment of the reactor, said cooling chamber having a temperature control unit inside.

In the chemical industry, reactors with relatively great dimensions are used for performing different kinds of chemical reactions on an industry scale. However, for the same purpose flasks of much smaller dimensions than those of such reactors are used in the laboratory scale practice. In many cases, it is preferred to produce the desired reaction product(s) in small quantities and within a short time, such as e.g. in the reaction optimizing stage of a research work. So called microfluidic reactors can be regarded as laboratory reactors for this purpose.

In the prior art, the term "microfluidic reactor" commonly refers to a sealed channel provided with an inlet and an outlet and used to accommodate a reaction mixture flowing continuously or intermittently with short periods of temporary stops, wherein the dimension of said channel perpendicular to the direction of flow of the reaction mixture does not exceed 0.5 mm. In microfluidic reactors, the length and the cross-sectional area of the channel, as well as the flow rate of the reaction mixture, are selected in such a manner that the time spent by the reaction mixture within the channel (from now on referred to as the residence time) be enough for the desired reaction to finish. The progress or even the retardation of the reaction is usually affected externally by heating or cooling. Accordingly, the microfluidic reactors are generally provided with external heating/cooling facilities. Furthermore, in a majority of applications, the microfluidic reactors are adapted to be capable of mixing/blending the components (reactants) of the reaction mixture through appropriate constructional modifications, for example by equipping them with suitable integrated mixing units. By means of adjusting the flow rate through the inlet, the type of flow of the reaction mixture within the microfluidic reactor can be selected to be laminar or turbulent. Furthermore, feeding the reactants into the channel and discharging the reaction product from the channel are assisted by providing adequate connectors at the inlet and the outlet. If a larger amount of reactants is needed for the reaction, i.e. when a larger amount of reaction product is to be produced, several reactor units are connected in parallel fluidically, thus the production capacity is increased while other benefits of the microfluidic reactors are preserved. Such a microfluidic reactor is disclosed in U.S. Patent Appl. No. 2003/0003024 A1.

Since mixing the reactants in microfluidic reactors is very efficient due to the shape and the small cross-sectional area of the available flow paths, the local fluctuation of the concentration of the reactants in the reaction mixture is minimal, or practically negligible. By blending the gas-phase reactants with the liquid-phase reactants in the microfluidic reactors while adding small bubbles and droplets alternatively (i.e. in a diffusion controlled reaction), a high ratio of the phase boundary surface to the channel volume may be achieved, which has a positive effect on the progress of the reaction. Moreover, because of the high ratio of the phase boundary surface to the channel volume, the effective temperature of the reaction mixture can be controlled rapidly and efficiently, thus if necessary, the ongoing reaction may be simply "frozen" by applying a quick cooling. However, if an exothermic reaction is desired to be effected in the microfluidic reactor, the start of non-desirable extra reactions can be simply prevented due to the capability of fast and efficient discharging of the produced heat. Another advantage of the use of microfluidic reactors is that the temperature and the residence time of the reaction mixture may be changed immediately, at any time during the reaction period, therefore at any moment, the most optimal reaction conditions may be set for the progress of the reaction. Accordingly, a reaction performed in such a manner may result in producing a larger amount of and cleaner reaction product than produced in a reaction executed in the absence of the most optimal conditions. Finally, due to the relatively small channel cross-sectional area and the capability of quick and reliable modification of the temperature, the otherwise explosive chemical reactions may also be executed at a high safety level.

The microfluidic reactors commonly used today are made of metal or glass (silica) with high mechanical strength and corrosion resistance. The channel(s) for accommodating the reaction mixture is (are) formed in the surface of a so called reactor block made of said metal or glass. This formation is carried out, for example, by photolithographic processes or chemical ion etching in case of glass, whereas, for example, by machining and/or die forming in case of metal reactor blocks, as it is described e.g. in detail in U.S. Pat. Appl. No. 2003/0003024 A1 and EP-1,473,077 A2. Subsequently, the channel(s) formed in the reactor block is covered with a closing member generally made of the same material as that of the reactor block, and then the reactor block and the closing member are fixed together in a sealed manner. In case of glass/silica elements, the sealing operation is performed by fusing the elements, whereas in case of metallic elements, by welding the elements together or by inserting one or more gasket(s) made of chemically resistant material between the peripheries of the elements and fastening said elements together, for example, by screwing. These mounting procedures are expensive, time-consuming and require the use of auxiliary devices (e.g. furnace, welding apparatus), on the one hand, and highly advanced manufacturing technologies, on the other hand. Furthermore, if cleaning of the channel is required, most of these reactors cannot be disassembled without being damaged, or the disassembly is rather complicated.

In addition, the channel walls formed by the aforementioned methods without an extra surface treatment are microscopically uneven (i.e. "fine grained") which results in a relatively large surface. Thus, the channel walls can be subject to an attack by strongly reacting reactants, such as ozone, or in a particular case, the structure of the wall may induce decomposition of any intermediate product of the reaction or even the reactants (ozone) themselves in an uncontrollable manner.

Accordingly, the object of the present invention is to eliminate the drawbacks of or at least improve the above mentioned microfluidic reactors commonly used today. In particular, an object of the present invention is to provide a method of forming a sealed channel of a microfluidic reactor which does not require the use of auxiliary devices/apparatuses, and in addition, it allows an inexpensive and simple manufacture of microfluidic reactors that are highly resistant against the reactive reactants. Another object of the present invention is to provide a method in which sealing of the channel that is required at fixing the reactor block and the closing member together by screwing is carried out at the same time as forming the channel in the reactor block, i.e. in the same manufacturing step. A further object of the present invention is to provide a microfluidic reactor which does not require a separate sealing operation of the channel during its assembly, and wherein the assembled reactor allows to execute a wide range of reactions, particularly the reactions followed by intensive heat generation, in a wide range of temperature with the capability of quickly adjusting the temperature of the channel.

In one aspect of the invention the above objects have been achieved by providing a method of forming a sealed channel in the surface of a sheet made of a material with certain extent of plasticity, the method comprising the steps of bringing the machining surface of a tool having a rolling machining surface into contact with a first point of the channel to be formed in the surface of the sheet constituting the reactor block; pressing said machining surface into the surface of the sheet with a compressive force required to create the depth of the channel to be formed, whereby the plastic material being squeezed out and becoming raised from the sheet surface along the peripheries of a depression being formed; while maintaining the compressive force, displacing said machining surface along the centerline of the channel over the sheet surface by rolling it from the first point of the channel to be formed to a second point thereof, whereby the channel being machined in the material of the sheet and sealing edges being created along the peripheries of the channel from the material squeezed out and become raised; arranging a closing member at the surface of the sheet provided with the channel and the sealing edges to bear against the sealing edges; pressing said closing member onto the sheet by a compressive force required to deform said sealing edges and fixing it in the position obtained, whereby a sealed channel running between the first and second points being formed within the reactor block.

It has been experienced that the ductile material squeezed out along and projecting from the peripheries of the obtained channel is particularly suitable for providing a seal with high resistance, which is concerned to be a surprising and unexpected effect. The thickness of the squeezed out material is in the range of 10 to 200 µm, and the fact that the squeezed out material provides an especially resistant sealing is likely due to surprising and unexpected structural changes in the material resulted from the increased shearing force leading to the squeeze out of the material.

Further preferred embodiments of the method according to the invention are disclosed herein.

In a further aspect of the invention, the above objects have been achieved by providing a microfluidic reactor in which the channel extends as a depression of a face constituting the reactor block, said face being opposite to the face of the reactor block in contact with the first limiting member, wherein peripheries of the channel are bounded by regions forming sealing edges projecting from the face of the reactor block formed by deforming thereof, and wherein the closing member is pressed to the face of the reactor block carrying the channel so that said closing member bears against the sealing edges, and wherein the temperature control unit is pressed to the surface of the closing member opposite to the sealing edges.

Further preferred embodiments of the microfluidic reactor according to the invention are specified herein.

The invention will now be described in detail with reference to the accompanying drawings, wherein FIG. 1 is a front view with a partial sectional view of an embodiment of the microfluidic reactor according to the invention;

Figure 1:
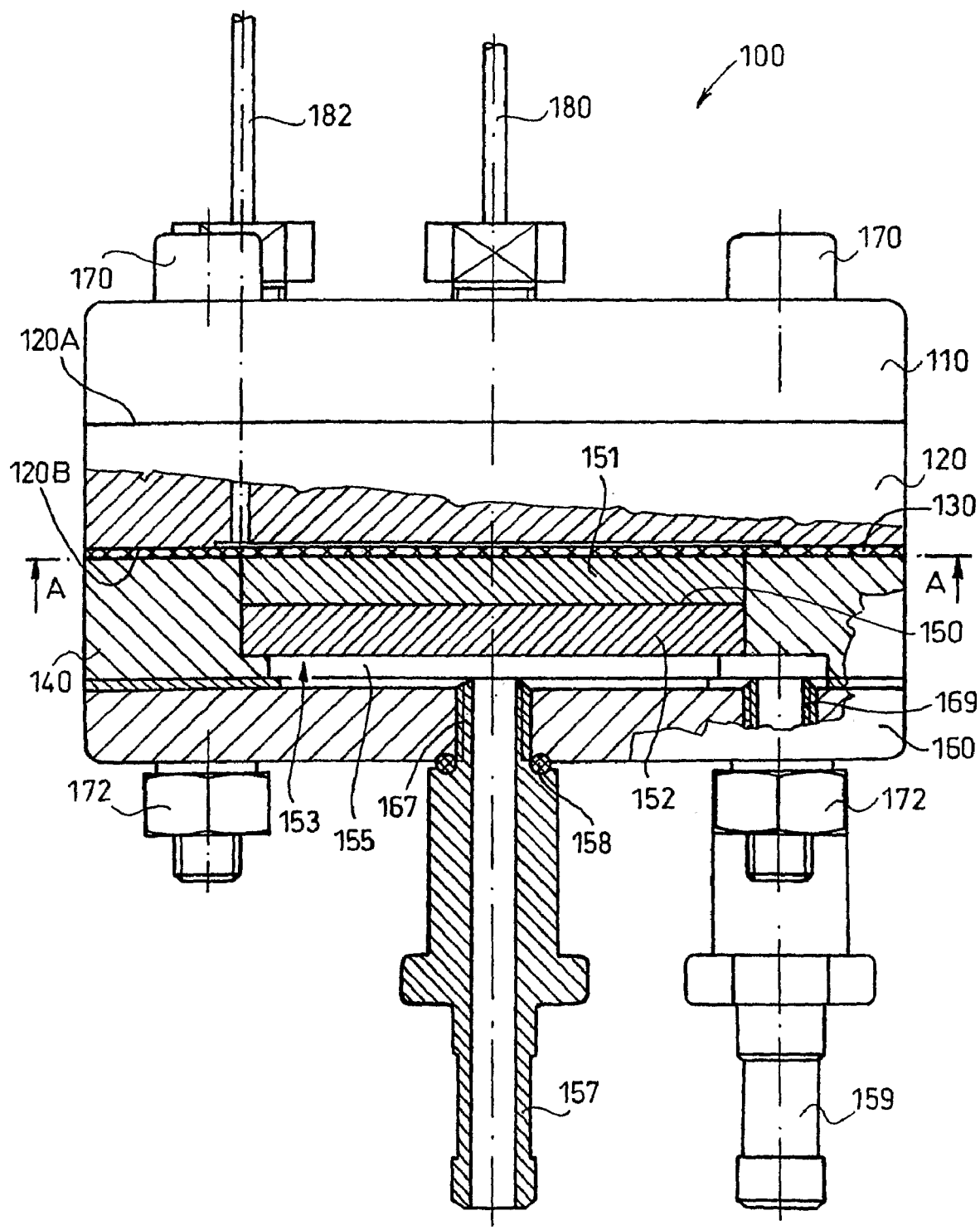

FIG. 1 illustrates a microfluidic reactor 100 comprising a reactor block 120 defined by a first face 120A and a second face 120B, a first limiting member 110 in contact with the first face 120A of the reactor block 120, a closing member 130 covering the second face 120B of the reactor block 120, a supporting member 140 in contact with the closing member 130 along its peripheries, and a second limiting member 160 abutting on the face of the supporting member 140 opposite to the closing member 130. The closing member 130, the supporting member 140 and the limiting member 160 together define a cooling chamber 153 therebetween. Within the cooling chamber 153, a temperature control unit 150 is arranged in contact with the closing member 130. The temperature control unit 150 is firmly fixed in its place by the supporting member 140. In this arrangement, the temperature control unit 150 is separated from the second limiting member 160 by a clearance, that is, the temperature control unit 150 and the second limiting member 160 do not contact each other. The cooling chamber 153 is in communication with the external environment through preferably threaded through-holes 167, 169 formed in the second limiting member 160.

Figure 2:
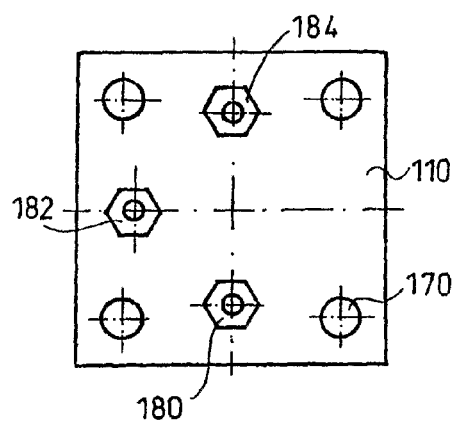
FIG. 2 is a plan view of the microfluidic reactor illustrated in FIG. 1.

The first and second limiting members 110, 160 serves for holding together the elements arranged therebetween and protecting them against external mechanical impacts. Accordingly, the limiting members 110, 160 are made of steel, for example stainless steel, of high mechanical strength. The limiting member 110 is further provided with through-holes (not shown) to allow communication between the external environment and the channel formed in the reactor block 120. These through-holes are formed preferably as threaded through-holes that are adapted to receive e.g. connectors 180, 182, 184 shown in FIG. 2 in a sealed and releasable manner. One of the through-holes 167, 169 receives a coolant feeding means 157 opening into a flow channel 155 defined by the clearance adjacent to the temperature control unit 150 of the reactor 100. Said coolant feeding means 157 is received in a sealed and releasable manner. The sealed connection of the coolant feeding means 157 is provided by a gasket 158 arranged between the limiting member 160 and the coolant feeding means 157 itself. The gasket 158 is preferably formed as an O-type ring. The other one of the threaded through-holes 167, 169 formed in the limiting member 160 is adapted to receive a coolant discharging means 159 in a sealed and releasable manner, wherein said coolant discharging means 159 opens from the clearance 155. The sealed connection of the coolant discharging means 159 is provided by a gasket (not shown in the figures) arranged between the limiting member 160 and the coolant discharging means 159 itself, wherein the gasket is preferably formed as an O-type ring.

The reactor block 120 constitutes the central part of the microfluidic reactor 100. It is made of a chemically resistant, easily machinable heat-resistant material. The material of the reactor block 120 is a chemically resistant plastic material, preferably a fluorinated and/or chlorinated polymer, more preferably polytetrafluoroethylene (PTFE). The channel 125, that is used to ensure a proper space for the reactants or the mixture thereof during the operation of the reactor 100, as well as to accommodate the desired chemical reaction, is formed in the face 120B of the reactor block 120. Details of the channel 125 are shown in FIG. 3.

Figure 3:
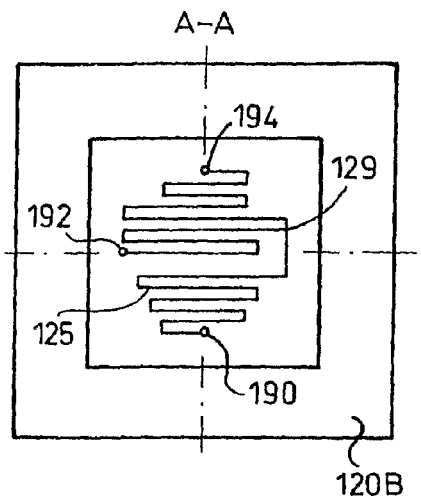
FIG. 3 is a sectional view of the microfluidic reactor shown in FIG. 1 along the line A-A.

The embodiment of the channel 125 shown in FIG. 3 comprises pass-throughs 190, 192, 194 in flow communication with connectors 180, 182, 184, respectively. In this embodiment, the pass-throughs 190, 192 are used to feed the reactants, whereas the pass-through 194 is used to discharge the reaction product of the chemical reaction taking place in the reaction mixture produced by a mixer 129 integrated into the channel 125. In this embodiment, the mixer 129 is formed by a Y-shaped junction arranged in the channel 125. The length of the section of the channel 125 between the mixer 129 and the pass-through 194 is selected so that the desired chemical reaction of the reactants getting contacted with each other by means of the mixer 129 be executed before the reactants reach the pass-through 194. As shown in FIG. 3, in order to facilitate the design of the reactor 100 with reduced dimensions, the channel 125 consists of relatively long sections running in parallel and relatively short sections running perpendicularly to the former ones. Another advantage of this topology of the channel 125 is that the temperature of the reactants/reaction mixture may be changed quickly and reliably due to the large ratio of the channel surface to the channel volume. Of course, the shape of the channel 125 may be different from the illustrated one. For example, the channel 125 may comprise helical branches joining in the mixer 129 while keeping the benefit of the efficient temperature control.

Figure 5A:
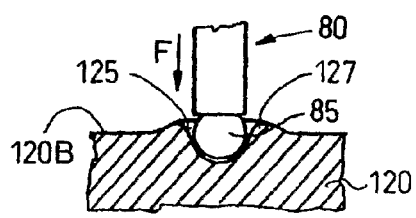
FIG. 5A illustrates the channel of the microfluidic reactor according to the invention during its formation by preferably using a ball-type machining tool, in a cross-sectional view perpendicular to the direction of flow.
Figure 5B:
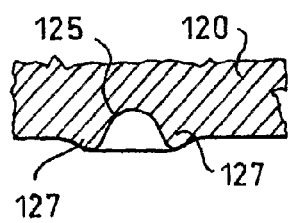
FIG. 5B illustrates the finished channel in a cross-sectional view perpendicular to the direction of flow within an assembled microfluidic reactor.

As illustrated in FIG. 5B, the channel 125 is formed in the face 120B in such a manner that after properly clamping the reactor block 120, a machining tool with a rolling machining surface, preferably a ball-type machining tool 80 is pressed onto the face 120B by applying a compressive force F selected depending on the material and the plasticity of the reactor block 120, wherein said rolling machining surface is guided, according to a program, in a guiding (or controlling) device put onto the place of the limiting member 110. The value of the applied compressive force F is selected to cause the ball 85 of the machining tool 80 to intrude into the body of the reactor block 120 to an extent of the entire desired depth of the channel 125 to be formed. The channel 125 is then formed by continuously advancing the ball-type machining tool 80 along a predetermined path of the required channel 125 according to an appropriate adjustment of the control, wherein the rate of advance is typically in the range of 0.1 to 5 mm/sec. During the continuous advancing motion of the machining tool 80 with the rolling machining surface, the material of the reactor block 120 is getting dense along the peripheries of the channel 125 and due to the arising shearing forces it becomes squeezed out, which results in the formation of a sealing edge 127 along both of the opposite peripheries of the channel 125, said sealing edges 127 extending parallel to the channel, as shown in FIG. 5B. Dimensions of the channel 125 and the sealing edges 127 depend on the diameter of the machining surface of the machining tool.

When said ball-type machining tool 80 is used, the width of the channel 125 and the size of the sealing edges 127 formed together with the channel 125 may be adjusted by changing the diameter of the ball 85 of the machining tool 80. The depth of the channel 125 may be adjusted by changing the height position of the ball 85 of the ball-type machining tool 80. It is obvious for one skilled in the art that instead of a special spherical machining surface provided by the ball 85, other machining surfaces, like a cylindrical surface, may also be applied.

In case of forming the channel 125 manually, marking the trace of the channel 125 is performed by scribing the trace on the face 120B beforehand. However, in case of mechanized forming of the channel 125, the desired trace is stored in the device guiding the ball-type machining tool 80, preferably as digital data.

Sealing of the channel 125 formed in the reactor block 120 is carried out by placing the closing member 130 onto the face 120B or the sealing edges 127 projecting therefrom, and by applying a compressive force perpendicular to the plane of the closing member 130. Due to the applied force, the sealing edges 127 become deformed that results in a sealed joint between the reactor block 120 and the closing member 130. It should be noted that in this case, the compressive force is distributed only over the sealing edges 127 of the face 120B, instead of the whole face 120B, which yields more reliable sealing. For the closing member 130, a sheet-like member/film made of a material with good thermal conductivity and chemical resistance as well as having smooth surfaces is used. If good thermal conductivity is an essential requirement, the closing member 130 is made of a PTFE film with a thickness of up to 20 μm.

After sealing the channel 125, the reactor block 120 is provided with through-holes in the thickness of the reactor block 120 at the pass-throughs 190, 192, 194 in order to allow the communication between the connectors 180, 182, 184 and the pass-throughs 190, 192, 194, respectively.

It is preferred that the supporting member 140 is in the form of a square frame made of aluminum.

The temperature control unit 150 accommodated within the supporting member 140 is arranged at an opposite surface of the closing member 130 relative to the channel 125, in a position where it is in contact with the closing member 130, as shown in FIG. 1. A preferred embodiment of the temperature control unit 150 is arranged preferably in a cascaded-type Peltier-unit (comprising a plurality of, but preferably two Peltier-elements in contact with one another), the operation of which is based on the Peltier-effect. As it is obvious for one skilled in the art, a Peltier-element is a device comprising two thin ceramic sheets and a plurality of semiconductor sheets therebetween, which provides a constant difference of temperature between its two sides when an appropriate current and voltage is applied on the device. In its simplest form, there are two different metal layers on the bottom side of the Peltier-element through which a current is flowing which results in a thermal flow between the metal layers. Thus a cold side and a warm side are obtained. The cold side of a first Peltier-element 151 of the temperature control unit 150 used in the microfluidic reactor 100 according to the invention is in contact, through the closing member 130, with the reactor block 120 or the reactants/reaction mixture accommodated within the channel 125. At the same time, the warm side of the first Peltier-element 151 of the temperature control unit 150 used in the microfluidic reactor 100 is in contact with the cold side of a second Peltier-element 152. The temperature control unit 150 used to control the temperature of the reactor 100 according to the invention is formed by an integrated unit of the two aforementioned Peltier-elements 151, 152, preferably within a common casing. The second Peltier-element 152 in contact with and consequently also cooling the warm side of the first Peltier-element 151 is much more powerful than the first Peltier-element 151.

In the reactor 100 according to the invention, the heat produced on the warm side of the more powerful second Peltier-element 152 is removed by cooling for which a coolant is used. The coolant is introduced through the coolant feeding means 157 into a coolant flow channel 155 arranged between the temperature control unit 150 and the limiting member 160. The coolant is discharged therefrom through the coolant discharging means 159. For the coolant, water is preferably used. The electrical conductors (not shown) required for the operation of the temperature control unit 150 formed by the two Peltier-elements 151, 152 are led out from the inside of the reactor 100 between the closing member 130 and the supporting member 140. By means of the temperature control unit 150 used within the reactor 100 according to the invention, the difference between the temperatures of the channel 125 and the external environment may reach even 70° C. if the thermal load is equal to zero. In case of a thermal load other than zero, the maximum temperature difference for the channel 125 is, of course, smaller, for example in case of a thermal load of +5 W and an external environmental temperature of 25° C., the temperature of the channel 125 may reach about −50° C. In addition, the maximum rate of change in the temperature in the channel 125 attainable by means of the temperature control unit 150 through the thin closing member 130 is about 8° C./sec (in the range of 0 to 20° C.). It is obvious for one skilled in the art that instead of the cascaded-type temperature control unit 150, other types of heating/cooling means may be equally applied.

Figure 4:
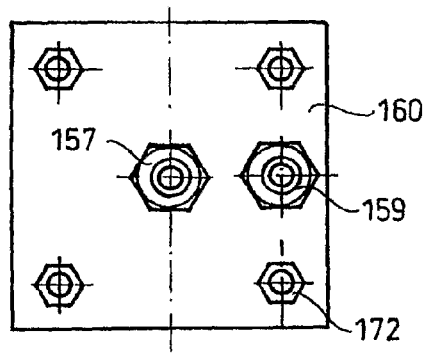
FIG. 4 is a bottom view of the microfluidic reactor of FIG. 1.

The first limiting member 110, the reactor block 120, the closing member 130 and the supporting member 140 of the temperature control unit 150 of the microfluidic reactor 100 according to the invention are held and clamped together by an appropriate fastening mechanism in order to create and maintain a perfect seal between the reactor block 120 and the closing member 130. In the embodiment shown in FIG. 1, the fastening mechanism is formed by through-bolts 170 inserted into through-holes (with no reference numbers) formed in each one of said parts and crossing over the entire thickness of the reactor 100, and by nuts 172 screwed thereon. It is obvious for one skilled in the art that said parts of the reactor 100 may be clamped together by means of other fastening mechanisms as well, for instance by means of spring-type locking mechanisms. Moreover, it should be noted that the number of the fastening elements of the applied fastening mechanism may vary depending on the shape of the planar projection of the reactor 100 (rectangular, square, circular, etc.). For example, in case of reactor 100 illustrated in FIGS. 2 to 4, where the reactor 100 has a square planar projection, four through-bolts 170 are used to ensure proper extent of fastening.

Subsequent to the formation of the channel 125 and the sealing edges 127 by means of the ball-type machining tool 80, assembly of the microfluidic reactor 100 according to the invention is carried out by performing the following steps. First, the through-bolts 170 are inserted into the through-holes arranged in the limiting member 110, and then the reactor block 120 is arranged on the limiting member 110, with its face 120A facing to the limiting member 110. Next, the closing member 130 is put on the sealing edges 127 formed in the face 120B of the reactor block 120. In the following step, the supporting member 140 and the temperature control unit 150 placed therein beforehand are put together on the surface of the closing member 130 opposite to the channel 125, and after arranging the limiting member 160 on the through-bolts 170, said parts of the reactor 100 are clamped together by screwing the nuts 172 onto the through-bolts 170. Sealing the joint between the channel 125 and the closing member 130 by means of the sealing edges 127 is carried out by screwing the nuts 172 onto the bolts 170. Finally, the connectors 180, 182, 184 are fixed in the through-holes of the limiting member 110, and the coolant feeding means 157 and the coolant discharging means 159 are fixed to the respective through-holes 167, 169 of the limiting member 160.

Figure 6:
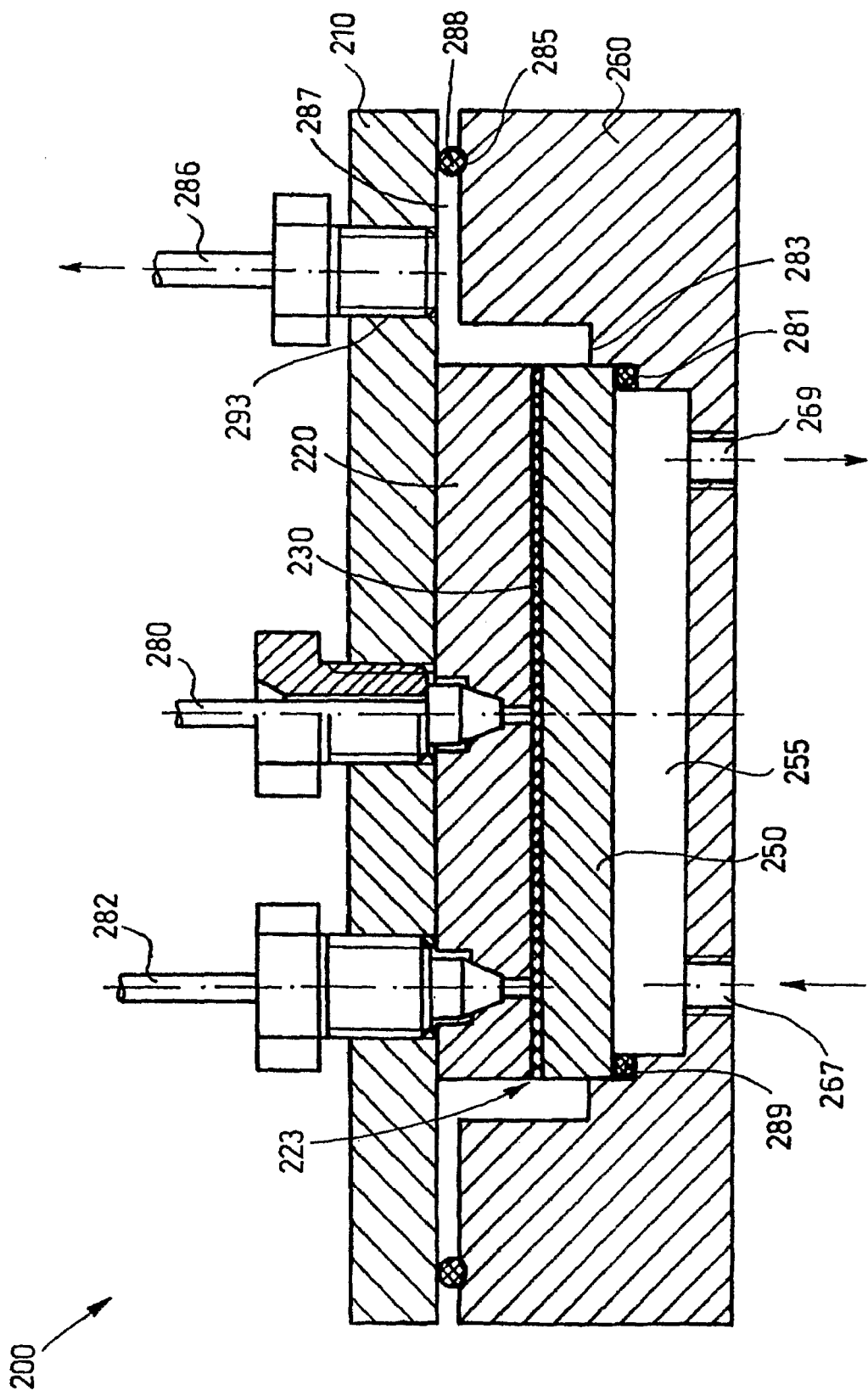
FIG. 6 is a schematic view of another embodiment of the microfluidic reactor according to the invention.

FIG. 6 illustrates a possible further preferred embodiment of the microfluidic reactor 200 according to the invention. The reactor 200 differs from the reactor 100 shown in FIG. 1 in the way of fastening, i.e. while the closing member 130 is pressed to the sealing edges 127 by screwing the parts of the reactor 100 together in case of the reactor 100, here the compressive force is provided by vacuum.

As illustrated in FIG. 6, the microfluidic reactor 200 comprises a reactor block 220, a first limiting member 210 in contact with one face of the reactor block 220 and extending beyond its peripheries, a closing member 230 covering the face of the reactor block 220 opposite to the limiting member 210, and a second limiting member 260 facing to the first limiting member 210. The channel and the sealing edges along it (neither shown in the figure) are formed in the surface of the reactor block 220 facing to the closing member 230, by performing the above mentioned method according to the invention. On the side of the closing member 230 opposite to the reactor block 220, a temperature control unit 250 is arranged in contact with said side of the closing member 230. In this embodiment, the reactor block 220, the closing member 230 arranged thereon and the temperature control unit 250 in contact with the closing member 230 together form a reactor core 223 having a particular transversal dimension. The second limiting member 260 is adapted to receive the reactor core 223. The surface of the limiting member 260 facing to the first limiting member 210 has a sectional profile comprising segments defined by a first step 281 and a second step 283.

There is a groove 285 formed in a region of the limiting member 260 adjacent to its surface facing to the limiting member 210. In the groove 285, a sealing member 288 is inserted. On the surface of the step 281, a sealing member 289 extending annularly in the limiting member 260 is arranged.

The assembled microfluidic reactor 200 abuts on the one hand on the sealing member 288 arranged in the groove 285 of the first limiting member 210 and on the other hand on the sealing member 289 of the temperature control unit 250. Thus the first limiting member 210, the second limiting member 260 and the reactor core 223 define together a closed chamber 287. This closed chamber 287 communicates with the external environment via a preferably threaded through-hole 293 formed in the first limiting member 210. In a particular case, the through-hole 293 is adapted to receive a vacuum connector 286 equipped with a plug valve in a sealed and releasable manner. The vacuum connector 286 is connected to a suitable vacuum pump (not shown). The temperature control unit 250 and the limiting member 260 define together a flow channel 255 for circulating the coolant. The flow channel 255 is in flow communication with the external environment via the through-holes 267, 269 formed in the second limiting member 260. The sealing members 288, 289 are preferably made of rubber or other material with given flexibility.

Energizing a vacuum pump connected to the vacuum connector 286 creates vacuum within the chamber 287, which pulls the first and second limiting members 210, 260 towards each other against the retaining effect of the sealing members 288, 289. As a result, the compressive force induced at the sealing member 288 pushes the temperature control unit 250 to the closing member 230 that, in turn, is pressed to the sealing edges formed in the reactor block 220 which results in a perfect seal of the channel. After reaching a predetermined extent of vacuum within the chamber 287, the force that presses the closing member 230 to the sealing edges formed on the reactor block 220 is set to a constant value by closing the plug valve of the vacuum connector 286. If necessary, the plug valve may be opened to operate the vacuum pump again so that the extent of vacuum (and hence the magnitude of the compressive force) be maintained constant.

The vacuum based fastening used for the microfluidic reactor 200 results in a uniform force distribution over the sealing edges, which further improves sealing of the channel used for accommodating the reaction.

In a preferred embodiment of the microfluidic reactor 100, 200 according to the invention, the entire surface used for forming the fluidic construction is 25 cm$^2$, the channel has a length of 65 mm, the average diameter of the channel is 400 µm, the depth of the channel is also 400 µm, the number of inlets and outlets is three, a single mixer is used, the lowest reachable temperature of the channel is −50° C. (at a thermal load of +5 W), the highest reachable temperature of the channel is 150° C., the maximum operational pressure of the reactor is 30 bar, and the maximum rate of change in temperature is 8° C./sec (within the range of 0 to 20° C.). It is appreciated that depending on the particular reaction, the microfluidic reactor 100, 200 according to the invention may have different dimensions, different number of mixers and different number of inlets and outlets as well.

The microfluidic reactors 100, 200 according to the invention are particularly suitable for executing various ozonolysis reactions, as described in the following example, because in such reactions taking place in a heterogeneous (gas/liquid) phase, the values and the controlling capabilities of the time of contact and the size of the contact surface are critical. Moreover, as these reactions are exothermic, it is essential to divert the reaction heat quickly and reliably, which is greatly enhanced by the extra thin closing member arranged between the channel and the heating/cooling unit of the microfluidic reactor according to the invention. In order to maintain the control over the ozonolysis reactions, i.e. to control the reaction rate, it is necessary for the majority of such reactions to keep the reaction temperature below the ambient temperature and to provide a cooled environment for the subsequent chemical processing of the intermediate products (ozonides) resulted from ozonolysis reactions. Furthermore, ozonides are very unstable and thus extremely explosive.

EXAMPLE

A solution (1:1) of 5-metil-1-H-indol in methanol/dichloromethane with a concentration of 0.025 mol/l was introduced into the channel 125 of the microfluidic reactor 100 according to the invention, through the connector 180 and the pass-through 190, while a gaseous mixture of ozone and oxygen in a constant amount of 5% volume by volume was introduced into the channel 125 through the connector 182 and the pass-through 192. The flow rate of the solution of the 5-metil-1-H-indol through the reactor 100 was constant 0.25 ml/min, wherein a pressure of 5 bar was continuously maintained in the reactor 100 during the entire process. The reaction was executed at a temperature of 0° C. The reaction product discharged from the reactor 100 through the pass-through 194 and the connector 184 was dropped onto NaBH$_4$ (sodium borohydride) suspended in a mixture (1:1) of methanol and dichloroethane. This second reagent (i.e. the NaBH$_4$) ensured the decomposition of the intermediate product of the reaction (the resulted ozonide). In particular, the intermediate product may be equally decomposed in a second (microfluidic) reactor of similar construction. The average residence time in the reactor 100 was in the order of seconds. The reaction product was N-(2-hydroxy methyl-4-methylphenyl)-formamide. According to a HPLC (High Performance Liquid Chromatography) analysis, the degree of purity of the reaction product was 98%.

The yield of reactions performed in conventional reactors is about 60 to 65% [see for example the Journal of the Chemical Society (1953), pp. 3440-3443 or the Journal of the Chemical Society (1950), pp. 612-618], which primarily results from the difficultly controllable reaction conditions and thus from the proportion of the side products of the reaction. In case of a reaction with improved conditions, the yield decreases proportionally with an increase in the degree of purity, i.e. the productivity decreases proportionally when the degree of purity of the product increases.

Summary: in case of the microfluidic reactor according to the invention, the required heat transfer is provided in such a way that the reaction mixture in the channel is contacted with the cooling unit through a very thin PTFE film with a thickness of about 20 µm, and that the channel has a relatively large surface/volume ratio. In addition, production of the microfluidic reactor according to the invention does not require an expensive manufacturing technology, as sealing of the channel may be carried out simply and in an inexpensive manner by means of forcing the sealing edges formed together with the channel by using a ball-type machining tool to the parts of the reactor by means of, for example, through-bolts or vacuum, and then fixing them in their fastened state. Moreover, for the purpose of cleaning, the microfluidic reactor according to the invention may be simply disassembled by unscrewing the fastening bolts or by releasing the vacuum, and after completing the cleaning procedure it may be assembled again. A further benefit of the invention is that at the stage of channel geometry optimization and/or manufacturing the prototype unique and subsequent modifications of the channel of the reactor may be also carried out easily and quickly.

The invention claimed is:

1. A method of forming a sealed channel (125) in the surface of a sheet with a width and length, constituting a reactor block and made of a material having a certain extent of plasticity for a microfluidic reactor, comprising the steps of
   (a) bringing the machining surface of a tool having a rolling machining surface into contact with a first point of the channel (125) to be formed in the surface of the sheet constituting the reactor block (120; 220);
   (b) pressing said machining surface into the surface of the sheet with a compressive force (F) required to create the depth of the channel (125) to be formed, whereby the plastic material being squeezed out and becoming raised from the sheet surface along the peripheries of a depression being formed;
   (c) while maintaining the compressive force (F), displacing said machining surface along the centerline of the channel (125) over the sheet surface by rolling it from the first point of the channel (125) to be formed to a second point thereof, whereby the channel (125) being machined in the material of the sheet and sealing edges (127) being created along the peripheries of the channel (125) from the material squeezed out and become raised;

(d) arranging a closing member (130; 230) at the surface of the sheet provided with the channel (125) and the sealing edges (127) to bear against the sealing edges (127);

(e) pressing said closing member (130; 230) onto the sheet by a compressive force required to deform said sealing edges (127) and fixing it in the position obtained, whereby a sealed channel (125) running between the first and second points being formed within the reactor block (120; 220), characterized in that in step (c) the displacing of said machining surface takes place in accordance with a channel structure of a desired pattern comprising at least one channel extending along both of the width and length of said sheet.

2. The method of claim 1, characterized in that the rolling machining surface is cylindrical.

3. The method of claim 1, characterized in that the rolling machining surface is spherical.

4. The method of claim 3, characterized in that the spherical machining surface is provided by the surface of a ball (85).

5. The method of claim 1, characterized in that the channel structure of a desired pattern is either scribed onto the surface of the sheet or is stored and used as digital data when displacing of said machining surface.

6. The method of claim 1, characterized in that an outlet and at least one inlet, all in flow communication with the channel (125), are formed in the face (120A) of the reactor block (120; 220) opposite to the face (120B) of the reactor block (120; 220) carrying the channel (125) by drilling the reactor block (120; 220) at the end points of the channel (125).

7. The method of claim 1, characterized in that the sheet of the reactor block (120; 220) is made of a plastic material with chemical resistance, preferably of fluorinated and/or chlorinated plastic, more preferably of polytetrafluoroethylene (PTFE).

8. The method of claim 1, characterized in that the compressive force required to deform the sealing edges (127) is applied by making use of vacuum.

9. A microfluidic reactor comprising a sealed channel for accommodating a chemical reaction, said channel being provided with an inlet and an outlet for communicating with the external environment of the reactor, the reactor further comprising a first and a second limiting member that are held and clamped together by fastening means, a reactor block arranged between said limiting members, a closing member and a cooling chamber communicating with the external environment of the reactor, wherein a temperature control unit is arranged within said cooling chamber, characterized in that the channel (125) extends as a depression of a face (120B) constituting the reactor block (120; 220), said face (120B) being opposite to the face (120A) of the reactor block (120; 220) in contact with the first limiting member (110; 210), wherein peripheries of the channel (125) are bounded by regions forming sealing edges (127) projecting from the face (120B) of the reactor block (120; 220) formed by deforming thereof, and wherein the closing member (130; 230) is pressed to the face (120B) of the reactor block (120; 220) carrying the channel (125) so that said closing member (130; 230) bears against the sealing edges (127), and wherein the temperature control unit (150; 250) formed as a cascaded-type Peltier-unit is pressed to the surface of the closing member (130; 230) opposite to the sealing edges (127).

10. The microfluidic reactor of claim 9, characterized in that the reactor block (120; 220) and the closing member (130; 230) are made of chemically resistant material.

11. The microfluidic reactor of claim 10, characterized in that the reactor block (120; 220) is made of a chemically resistant plastic material, preferably of fluorinated and/or chlorinated plastic, more preferably of polyterafluoroethylene (PTFE).

12. The microfluidic reactor of claim 10, characterized in that the closing member (130; 230) is made of a PTFE film having a thickness of up to 20 μm.

13. The microfluidic reactor of claim 12, characterized in that the cascaded-type Peltier-unit comprises a first Peltier-element (151) and a second Peltier-element (152) arranged in contact with one another within a common casing.

14. The microfluidic reactor of claim 9, characterized in that a coolant flowing channel (155; 255) is formed in the cooling chamber (153) in the surface of the temperature control unit (150; 250) opposite to the closing member (130; 230).

15. The microfluidic reactor of claim 9, characterized in that the second limiting member (260) is arranged opposite to the first limiting member (210) and to a reactor part formed by the reactor core (223) comprising the reactor block (220), the closing member (230) arranged thereon and the temperature control unit (250) pressed to the closing member (230), said second limiting member (260) being adapted to receive the reactor core (223) with a lateral clearance, wherein between the first limiting member (230) and the second limiting member (260) and between the reactor core (223) and the second limiting member (260) a respective sealing member (288, 289) is inserted for providing a chamber (287) for vacuum.

16. The microfluidic reactor of claim 15, characterized in that the chamber (287) communicates with the external environment via a through-hole (293) formed in the first limiting member (210) and the chamber (287) is adapted to receive a vacuum connector (286).

* * * * *